United States Patent [19]

Beinvogl

[11] Patent Number: 4,731,343

[45] Date of Patent: Mar. 15, 1988

[54] METHOD FOR MANUFACTURING INSULATION SEPARATING THE ACTIVE REGIONS OF A VLSI CMOS CIRCUIT

[75] Inventor: Willy Beinvogl, Munich, Fed. Rep. of Germany

[73] Assignee: Siemens Aktiengesellschaft, Berlin and Munich, Fed. Rep. of Germany

[21] Appl. No.: 80,197

[22] Filed: Jul. 31, 1987

Related U.S. Application Data

[63] Continuation of Ser. No. 802,258, Nov. 27, 1985, abandoned.

[30] Foreign Application Priority Data

Dec. 13, 1984 [DE] Fed. Rep. of Germany ....... 3445527

[51] Int. Cl.$^4$ ............................................ H01L 21/76
[52] U.S. Cl. ...................................... 437/63; 437/57; 437/61; 437/238
[58] Field of Search ....................... 437/61, 63, 56, 57, 437/58, 235, 238; 156/643, 653, 657; 357/49, 5 C, 42

[56] References Cited

U.S. PATENT DOCUMENTS

| | | | |
|---|---|---|---|
| 3,752,711 | 8/1973 | Kooi et al. | 148/DIG. 117 |
| 3,852,104 | 12/1974 | Kooi et al. | 148/DIG. 117 |
| 4,139,442 | 2/1979 | Bondur et al. | 204/192 |
| 4,170,492 | 10/1979 | Bartlett et al. | 29/571 |
| 4,325,169 | 4/1982 | Pander et al. | 29/571 |
| 4,418,094 | 11/1983 | See et al. | 427/38 |
| 4,420,344 | 12/1983 | Davies et al. | 29/571 |
| 4,435,896 | 3/1984 | Parillo et al. | 29/571 |
| 4,442,591 | 4/1984 | Haken | 29/571 |
| 4,454,648 | 6/1984 | Hsia | 29/571 |
| 4,484,978 | 11/1984 | Keyser | 156/651 |
| 4,484,979 | 11/1984 | Stocker | 156/651 |
| 4,490,736 | 12/1984 | McElroy | 29/576 B |
| 4,561,170 | 12/1985 | Dacring et al. | 29/576 B |
| 4,562,638 | 1/1986 | Schwabe et al. | 357/42 |

OTHER PUBLICATIONS

Zarowin; C. B., "Plasma Etch Anisatropy...", Journal of the Electrochemical Society, vol. 130, #5, May 1983, pp. 1144–1152.

Philips Research Reports, vol. 26, No. 3, Jun. 1971, "Local Oxidation of Silicon; New Technical Aspects", pp. 157–165, Appels and Paffen.

IEDM Technical Digest, 1982, pp. 220–223, "Electrical Properties of MOS Devices Made with Silo Technology", Hui et al.

IEDM Technical Digest, 1982, pp. 224–227, "The Swami—A Defect Free and Near-Zero Bird's-Beak Local Oxidation Process and Its Application in VLSI Technology", Chiu et al.

IEEE Transaction on Electronic Devices, No. 4, Ed-29, Apr. 1982, pp. 541–547, "Direct Moat Isolation for VLSI", Wang et al.

Primary Examiner—Brian Hearn
Assistant Examiner—Kevin McAndrews
Attorney, Agent, or Firm—Hill, Van Santen, Steadman & Simpson

[57] ABSTRACT

The invention relates to a method for the manufacture of insulating portions separating the active regions of a VLSI CMOS circuit wherein an oxide coated silicon substrate is etched in those regions in which minimal insulation is to be required by etching trenches in the oxide insulating layers overlying the minimal insulation regions and generating field oxide regions in the remaining portions separating the active regions. The etching is preferably carried out by a combination of dry and wet etching steps. The field oxide regions may be produced by the well known local oxidation of silicon (LOCOS).

5 Claims, 7 Drawing Figures

METHOD FOR MANUFACTURING INSULATION SEPARATING THE ACTIVE REGIONS OF A VLSI CMOS CIRCUIT

This is a continuation, of application Ser. No. 802,258, filed Nov. 27, 1985 abandoned.

BACKGROUND OF THE INVENTION

1. Field of the Invention

This invention is in the field of manufacturing CMOS circuits using dried moat etchings to separate some portions of the active circuits, and conventional local oxidation of silicon (LOCOS) technology to separate other portions of the active circuits.

2. Description of the Prior Art

There are several possibilities of electrically insulating active regions, for example transistors, in integrated circuits such as in VLSI (very large scale integration) circuits from one another. The best known is that of local oxidation of silicon, usually referred to as LOCOS. In this type of technique, the insulation regions are thermally oxidized through the use of an oxidation mask composed, for example, of silicon nitride. Details of various types of LOCOS procedures will be found in the article entitled "Local Oxidation of Silicon; New Technological Aspects" by Appels et al appearing in Philips Research Reports, Vol. 26, No. 3, June 1971, pages 157–165. That publication is incorporated herein by reference.

It is extremely difficult to produce insulation ridges smaller than 1.5 microns with a standard LOCOS technique because of the appearance of the so-called birds beak structure. As explained in the aforementioned article, when no silicon is etched away before oxidation of the silicon surface under the layer of silicon nitride, an oxide beak is formed. This beak is due to a pronounced lateral under-oxidation and a pronounced outward diffusion of the field implantation ions. This results in a higher amplitude dependency of the threshold voltage of narrow transistors. In the article of Appels et al, previously cited, a method is disclosed in which a combination of a silicon nitride and a silicon dioxide layer serve first as a diffusion mask and then as an oxidation mask. The field oxides produced in this manner, however, still have many crystal defects which considerably disturb the electrical properties of the components manufactured therefrom. Further difficulties are presented in the lithographic dissolution process and in the silicon nitride etching.

In order to modify these limits of the LOCOS technology, a number of modified LOCOS type methods have been proposed.

In an article by I. Hui et al appearing in the IEDM Technical Digest 1982, pages 220–223, there is disclosed a method wherein the crystal defects are eliminated and the electrical properties are improved by what is referred to as SILO (sealed interface local oxidation). This article suggests the use of a sandwich type structure composed of plasma-generated silicon nitride, together with oxide and nitride layers produced by low pressure chemical vapor deposition (LPCVD).

A further method of this type is disclosed in an article by Chiu et al (IEDM Technical Digest, 1982, pages 224–227). This article describes what is known as SWAMI (sidewall masked isolation) technology, based on the use of a sloped silicon sidewall and thin nitride around the island sidewalls such that both intrinsic nitride stress and volume expansion induced stress are greatly reduced. An insulation layer measuring in the sub-micron range cannot be achieved by the methods of this reference.

One technique which can be used to produce insulation in such a narrow width is the trench technique set forth in detail in U.S. Pat. No. 4,139,442. This patent is also incorporated herein by reference. This patent describes the production of deeply recessed oxidized regions in silicon by forming a series of deep trenches by the use of a reactive ion etching method. Several different modifications are disclosed, depending upon the relative ratio between the width and the depth of the trench. From a technical standpoint, however, this process is extremely involved and requires substantial numbers of masking procedures.

In an article by Wang et al appearing in the IEEE Transactions on Electron Devices, Vol. ED-29, NO. 4, April 1982, pages 541–547, there is disclosed a trench etching technique for the isolation of VLSI circuits referred to as the "direct moat isolation" process. This article is also incorporated herein by reference. In this type of technology, the active device area is formed by patterning a thick field oxide uniformly on the silicon substrate. This type of direct moat isolation makes more efficient use of the silicon area by reducing encroachment considerably, thus allowing closer packing of active devices from the conventional LOCOS approach.

SUMMARY OF THE INVENTION

The present invention has the objective of manufacturing CMOS circuits in VLSI technology, utilizing the direct moat technology to provide the significantly narrower insulating ridges, wherein the active regions are etched free in the form of trenches in the insulating layers in those regions of the circuit in which minimal insulation ridges are required. For the remaining regions, the known LOCOS technology is applied for the manufacture of the field oxide regions separating the active regions. One of the features of the present invention is that the oxide used for masking the field implantation in the p-zone is employed over the n-zone as a field oxide for the moat etching.

The advantages of the method of the present invention are detailed below.

1. The moat etching is capable of supplying significantly narrower insulation ridges than the LOCOS technology. It is therefore used at those locations where minimal insulation ridges are required, for example, in the cell field of a dynamic random access memory (DRAM). Lithography and etching tolerances in the manufacturing process due, for example, to overexposure or underetching lead to a reduction of the active regions in the LOCOS method, but lead to an enlargement of the active regions in trench etching. The invention takes advantage of this effect.

2. Since the insulation due to moat etching is only used in the n-zone, significantly lower field oxide thicknesses are adequate in that zone due to a self-insulating effect. Two different field oxide thicknesses are thus available in the process of the invention. The topographical problems at the insulation edges of the n-zone are noticeably reduced by the reduced oxide thickness.

3. No auxiliary mask is required.

Several etching methods can be used for removing the insulating oxide layer in the regions of the trench etching. In the present invention, it is preferred that the etching take place by a sequential combined dry and wet etching process using a dry etching with trifluoromethane and oxygen, followed by a wet etching in buffered hydrofluoric acid.

BRIEF DESCRIPTION OF THE DRAWINGS

Further details of the present invention will be set forth with reference to an exemplary embodiment referring to the trench etching in an n-zone of a CMOS process, shown in further detail in FIGS. 1 through 7.

DESCRIPTION OF THE PREFERRED EMBODIMENTS

Figure 1:
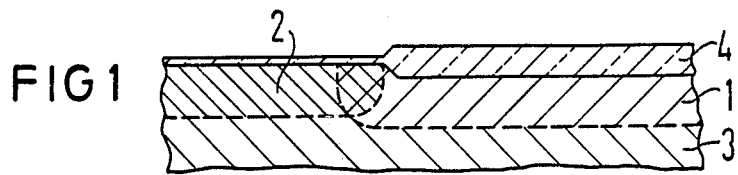
FIGS. 1 through 5 illustrate arrangements shown in enlarged cross section, of the individual stages in the manufacture of the insulation of the present invention.

FIG. 1 illustrates an n-zone equal to n-well which has been formed in a p-doped silicon substrate 3. A p-zone 2 is also formed in the substrate 3, after growing an oxide layer 4 which extends above the n-zone 1. The n-zone is produced by implantation of phosphorous or arsenic ion implantation after masking of the remaining regions of the substrate 3 and inward diffusion of the implanted ions, for example, to a depth of 3 microns. The p-zone 2 is generated by implanting, for example, boron ions.

Figure 2:
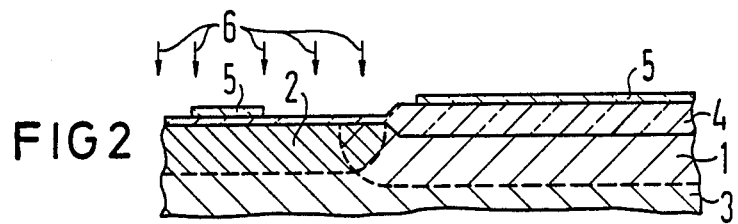

In FIG. 2, there is illustrated a surface-wide deposition of silicon nitride 5 which is patterned such that the n-zone region 1 in which the moat isolation is to be provided is covered and a field implantation with boron ions can be carried out in the p-zone region 2. The implantation with boron ions has been designated by the arrows 6. The regions above the edge of the n-zone 1 are also opened for the field implanatation and subsequent local oxidation.

Figure 3:
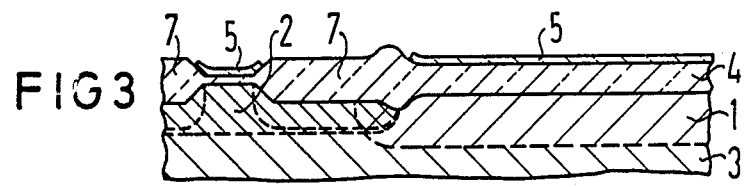

In FIG. 3, there is illustrated the condition existing after the application of a silicon nitride mask 5 followed by local oxidation to produce field oxide regions 7 by the aforementioned LOCOS techniques.

Figure 4:
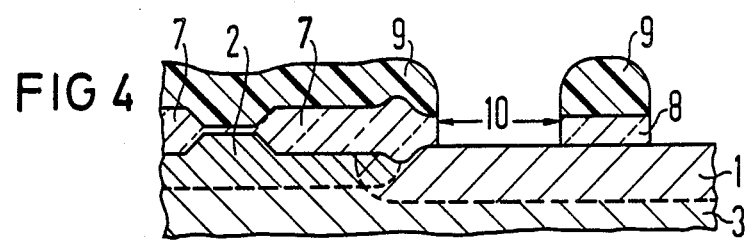

As illustrated in FIG. 4, after removal of the silicon nitride mask 5, for example, by means of hot phosphoric acid, the active regions in the n-zone 1 are defined by forming a trench etching 10. The p-zone region 2 and the oxide layer 4 serve as insulating ridges 8 which are covered with a photoresist mask 9. The etching of the moat 10 preferably takes place in two steps. In the first step, there is an anisotropic dry etching to within about 30–50 nm of complete removal level of the $SiO_2$ layer. The residual layer is then removed by wet chemical treatment, for example, in a buffered hydrofluoric acid solution. As a consequence, the silicon substrate on which the active elements such as memory cells are formed are not later exposed to a dry etching process.

Figure 5:
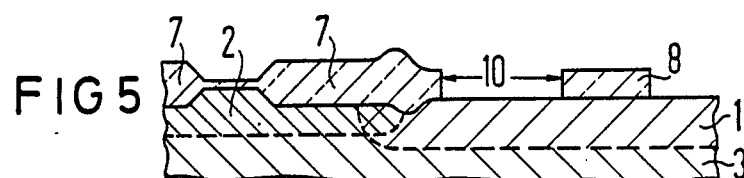

In FIG. 5, there is shown an arrangement which exists after the photoresist mask 9 has been removed. The same reference characters have been applied as in FIG. 4. A significant part of this process is the fact that with a suitable zone doping, a field oxide implantation such, for example, one consisting of phosphorous, into the n-zone region can be eliminated since the necessary surface doping of the parasitic n-channel transistor occurs due to the pile-up effect during the field oxidation in the formation of the oxide layer 4. The structure manufactured in this manner is further processed according to the known method steps of CMOS technology.

Figure 6:
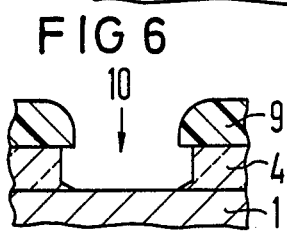
FIGS. 6 and 7 illustrate two etching structures which can be used to advantage in the practice of this invention.

FIG. 6 shows an etched structure where a dry etching has preceded a wet etching. This option has the advantage that potential damage to the substrate due to dry etching is prevented.

Figure 7:
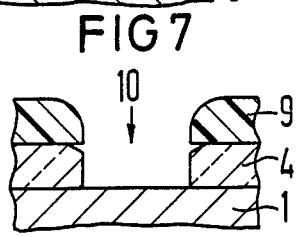

The reverse sequence results in the type of structure shown in FIG. 7, i.e., wet etching followed by dry etching. This option offers the advantage that the width of the insulation ridges is subject to lower tolerances than in the case of FIG. 6. The problem of substrate damage, however, requires a more complicated process sequence, including auxiliary oxidations. Both methods can be applied in combination.

The method of the present invention permits the manufacture of insulating ridges which are smaller than 1.5 microns and so can be employed in the manufacture of dynamic random access memories in the megabit range.

It should be evident that various modifications can be made to the described embodiments without departing from the scope of the present invention.

I claim as my invention:

1. A method for the manufacture of CMOS circuits which comprises:
    providing a p-doped silicon substrate,
    applying an implantation mask consisting of resist and silicon nitride over portions of said substrate,
    implanting and diffusing ions into said substrate through said mask to form an n-doped zone (n-well),
    removing said resist after said implanting of ions,
    oxidizing the surface of said substrate to produce an oxide layer thereover,
    implanting ions into said substrate to form a p-doped zone of lesser depth than said n-doped zone,
    depositing and structuring a layer of silicon nitride over said substrate to cover said n-doped zone while leaving portions of said p-doped zone in which field implantation is to occur uncovered,
    injecting boron ions into the uncovered portions,
    generating field oxide regions in said p-doped zone by local oxidation using the silicon nitride as a mask,
    removing the silicon nitride masking,
    masking the oxide layer over the p-doped zones with a photoresist layer while leaving portions of said n-doped zone uncovered, and
    etching moats into the oxide layer over said n-doped zone to provide ridges which insulate active regions of said substrate from one another.

2. A method according to claim 1 wherein the etching of moats is carried out by dry etching followed by wet etching.

3. A method according to claim 1 wherein said dry etching is carried out using trifluoromethane and oxygen, and said wet etching is carried out by using buffered hydrofluoric acid.

4. A method for the manufacture of CMOS circuits which comprises:
    providing a silicon substrate doped with ions of one conductivity type,
    applying an implantation mask consisting of a resist and silicon nitride over portions of said substrate,
    implanting and diffusing ions of the opposite conductivity type to form a doped well,
    removing said resist after said implanting of ions,
    oxidizing the surface of said substrate to produce an oxide layer thereover, implanting ions of said one conductivity type into said substrate to form a doped zone of lesser depth than said doped well, depositing and structuring a layer of silicon nitride over said substrate to cover said doped well while lealving portions of said doped zone of less depth in which field implantation is to occur uncovered, injecting ions of said second conductivity type into the uncovered portions, generating field oxide regions in said doped zone by local oxidation using the silicon nitride as a mask, removing the silicon nitride masking, masking the oxide layer over said doped zones with a photoresist layer while leaving portions of said doped well uncovered, and etching moats into the oxide layer over said doped well to produce insulating ridge separating the active regions of the substrate.

5. A method according to claim 4 wherein said ridges are smaller than 1.5 microns.

* * * * *